United States Patent
McMahon et al.

(10) Patent No.: US 6,173,489 B1
(45) Date of Patent: *Jan. 16, 2001

(54) ORGANIC SUBSTRATE (PCB) SLIP PLANE "STRESS DEFLECTOR" FOR FLIP CHIP DEVICES

(75) Inventors: John F. McMahon, Phoenix; Ravi Mahajan, Tempe, both of AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/032,628

(22) Filed: Feb. 27, 1998

Related U.S. Application Data

(62) Division of application No. 08/721,268, filed on Sep. 26, 1996, now Pat. No. 5,804,771.

(51) Int. Cl.[7] ........................................... H05K 3/34
(52) U.S. Cl. .............. 29/840; 29/832; 174/88 R; 174/94 R; 174/255; 361/795
(58) Field of Search .................. 29/840, 830, 832, 29/839; 156/289, 290, 52; 174/252, 255; 361/748, 749, 750, 795, 792; 428/901; 439/67, 91

(56) References Cited

U.S. PATENT DOCUMENTS

| | | |
|---|---|---|
| 4,847,136 | 7/1989 | Lo . |
| 5,289,337 | 2/1994 | Aghazadeh et al. . |
| 5,307,240 | 4/1994 | McMahon . |
| 5,321,583 | 6/1994 | McMahon . |
| 5,362,656 | 11/1994 | McMahon . |
| 5,375,041 | 12/1994 | McMahon . |
| 5,489,805 | 2/1996 | Hackitt et al. . |
| 5,557,502 | 9/1996 | Banerjee et al. . |
| 5,625,166 | 4/1997 | Natarajan . |
| 5,671,121 | 9/1997 | McMahon . |
| 5,734,555 | 3/1998 | McMahon . |
| 5,751,556 | 5/1998 | Butler et al. . |
| 5,773,895 | 6/1998 | Hassan et al. . |
| 5,777,345 | 7/1998 | Loder et al. . |
| 5,808,875 | 9/1998 | McMahon et al. . |
| 5,894,408 | 4/1999 | Stark et al. . |
| 5,933,324 | 8/1999 | Barrett . |
| 5,968,937 | 10/1999 | Chiu et al. . |
| 5,982,630 | 11/1999 | Bhatia . |

*Primary Examiner*—Lee Young
*Assistant Examiner*—Sean Smith
(74) *Attorney, Agent, or Firm*—Blakely, Sokoloff, Taylor & Zafman LLP

(57) ABSTRACT

A flip chip integrated circuit package which provides stress relief for the solder bumps of the package. The package includes an integrated circuit that is mounted to a substrate. The integrated circuit is attached to a plurality of bond pads of the substrate by a number of corresponding solder bumps. The substrate has a first layer that is attached to a second layer. An area that is located between the layers and adjacent to the bond pads is left unattached so that a portion of the first layer can move independent of the remaining portion of the substrate. The unattached area allows the integrated circuit to "float" and expand at a different rate than the substrate when the package is thermally cycled.

27 Claims, 2 Drawing Sheets

ORGANIC SUBSTRATE (PCB) SLIP PLANE "STRESS DEFLECTOR" FOR FLIP CHIP DEVICES

This U.S. Patent Application is a divisional of U.S. patent application Ser. No. 08/721,268 filed Sep. 26, 1996 now issued as U.S. Pat. No. 5,804,771 entitled "Organic Substrate (PCB) Slip Plane 'Stress Deflector' for Flip Chip Devices" by McMahon, et al. and claims the benefit thereof.

BACKGROUND OF THE INVENTION

1. Field of the Invention

The present invention relates to an integrated circuit package.

2. Description of Related Art

Integrated circuits are typically assembled into a package that is mounted to a printed circuit board. In some packages the integrated circuits are wire bonded to internal bond fingers of the package. The bond fingers are routed to external contacts that are soldered to the printed circuit board. The wire bonding process creates a process step that increases the cost of producing the package. Additionally, the bond wires may create an undesirable inductance within the package.

FIG. 1 shows an integrated circuit package commonly referred to as a "flip chip" package. Flip chip packages allow an integrated circuit 1 to be directly mounted to a substrate 2 without using bond wires. The flip chip substrate 2 is typically constructed as a printed circuit board which contains internal routing layers that couple a plurality of bond pads to external contacts of the substrate 2. The integrated circuit 1 has a plurality of solder bumps 3 that are reflowed to mount the die 1 to the bond pads of the substrate 2.

The integrated circuit 1 typically has a coefficient of thermal expansion that is different than the thermal coefficient of the substrate. As shown in FIG. 2, when the package is thermally cycled the integrated circuit die 1 expands at a different rate than the substrate 2. The differential expansion creates mechanical strain and stresses on the solder bumps 3. When thermally cycled the thermally induced stress may crack the solder bumps 3 and render the package inoperative. It has been found that the solder bumps of a flip chip package may fail at unacceptably high rates when the package is thermally cycled. It would be desirable to have a flip chip package that provides stress relief for the solder bumps to increase the life of the package.

SUMMARY OF THE INVENTION

The present invention is a flip chip integrated circuit package which provides stress relief for the solder bumps of the package. The package includes an integrated circuit that is mounted to a substrate. The integrated circuit is attached to a plurality of bond pads of the substrate by a number of corresponding solder bumps. The substrate has a first layer that is attached to a second layer. An area that is located between the layers and adjacent to the bond pads is left unattached so that a portion of the first layer can move relative to the remaining portion of the substrate. The unattached area allows the integrated circuit to "float" and expand at a different rate than the substrate when the package is thermally cycled.

DETAILED DESCRIPTION OF THE INVENTION

Figure 1:
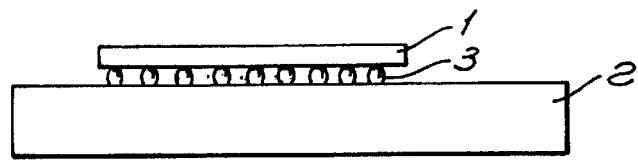
FIG. 1 is side view of an integrated circuit package of the prior art.
Figure 2:
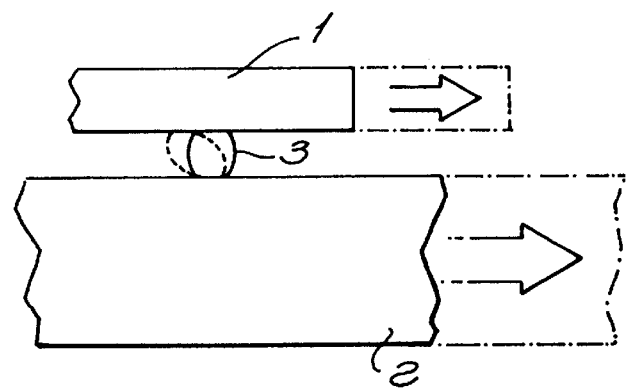
FIG. 2 is an enlarged sectional view of the package of FIG. 1 showing a thermal expansion of the package.
Figure 3:
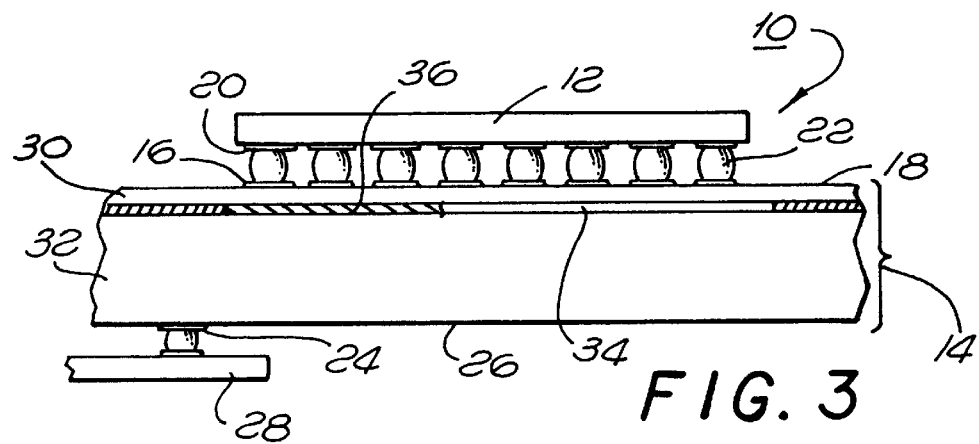
FIG. 3 is a side cross-sectional view of an integrated circuit package of the present invention.
Figure 4:
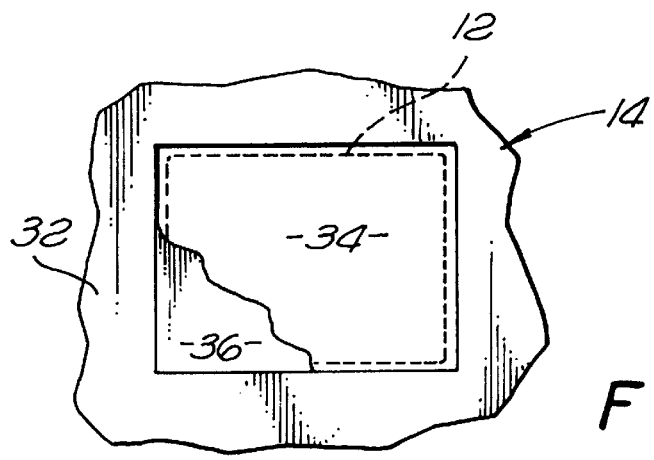
FIG. 4 is a top cross-sectional view of the integrated circuit package shown in FIG. 3.

Referring to the drawings more particularly by reference numbers, FIGS. 3 and 4 show an integrated circuit package 10 of the present invention. The package 10 includes an integrated circuit 12 that is mounted to a substrate 14. The integrated circuit 12 may be any semiconductor device such as a microprocessor. The substrate 14 is typically a printed circuit board that has a plurality of bond pads 16 located on a top surface 18. The bond pads 16 are connected to corresponding die pads 20 of the integrated circuit 12 by solder bumps 22.

The substrate 14 contains internal routing (not shown) which couples the bond pads 16 to a plurality of contacts 24 located on a bottom surface 26. The contacts 24 are typically soldered to an external printed circuit board 28. The substrate 14 electrically and mechanically couples the integrated circuit 12 to the external printed circuit board 28. Although a printed circuit board substrate 14 is shown and described, it is to be understood that the substrate 14 can be constructed with other known multi-layered substrate processes and materials.

The substrate 14 is typically constructed to have a first layer 30 and at least one second underlying layer 32. The first layer 30 may have the bond pads 16. The substrate 14 has an area 34 where the first layer 30 is not attached to the second layer 32. The unattached area 34 allows the adjacent portion of the first layer 30 to move and float relative to the underlying layer(s) 32 of the substrate 14.

The integrated circuit 12 typically has a coefficient of thermal expansion that is different than the thermal coefficient of the substrate 14. The integrated circuit 12 will therefore expand at a different rate than the substrate 14 when the package 10 is thermally cycled. The unattached area 34 allows the integrated circuit 12 to float relative to the substrate 14 during a change in the temperature of the package 10. The float reduces the thermally induced stresses on the die solder bumps 22 caused by the differential thermal coefficient of expansion of the die 12 and substrate 14.

The unattached area 34 may be created by inserting a shim 36 during the assembly process of the substrate 14. The shim 36 may be constructed from a material such as TEFLON® that will not become attached to the functional adhesive that is typically used to create the substrate 14. Alternatively, a chemical composition can be inserted into the area 341 during the assembly process, which reduces the bonding qualities of the adhesive so that the first layer 30 is not attached to the second layer 32 in the areas where the chemical is applied. Other processes or techniques may be employed to create a void or otherwise interrupt the bonding of the layers in the unattached area 34.

Figure 5:
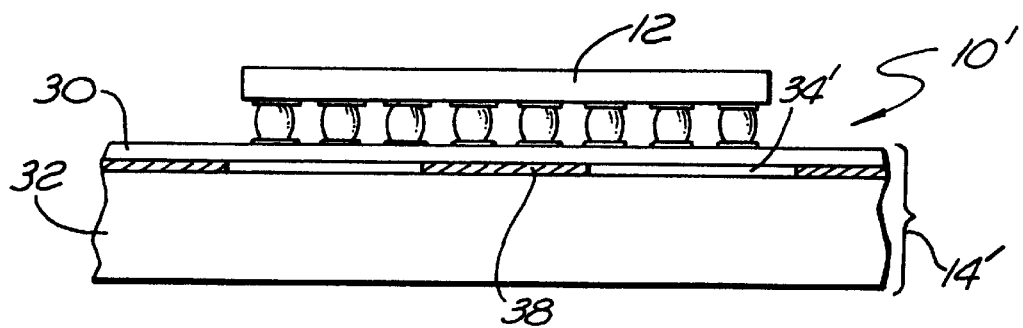
FIG. 5 is a side cross-sectional view of an alternate embodiment of the package.
Figure 6:
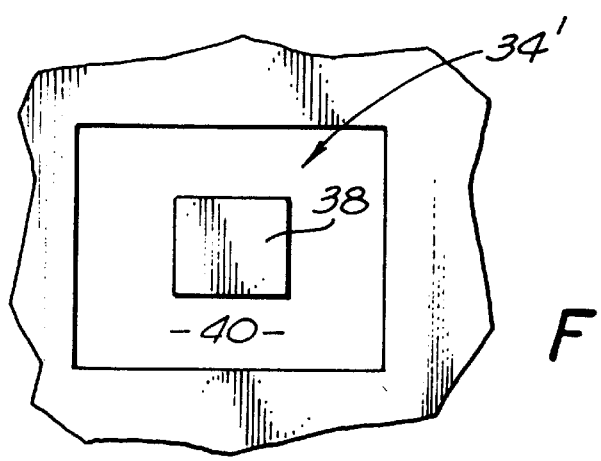
FIG. 6 is a top cross-sectional view of the package of FIG. 5.

FIGS. 5 and 6 show an alternate embodiment of a package 10' which has a pictuerd window shaped unattached area 34'.

The pictured window shaped area 34' is attached in a window shaped center portion 38 and unattached in an window frame shaped outer portion 40. The window shaped center portion 38 can be attached because minimal thermal expansion occurs at the center of the integrated circuit 12 and the substrate 14'.

Figure 7A:
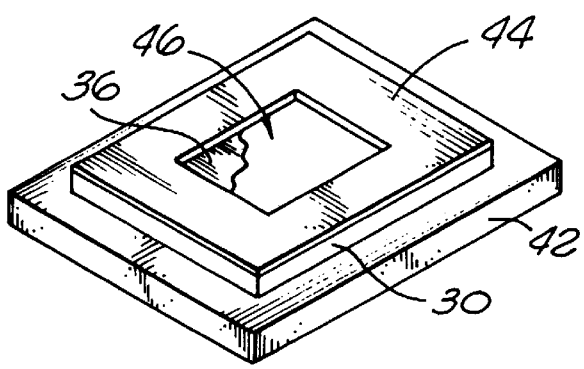
FIGS. 7a–b show a method for constructing a substrate of the integrated circuit package.
Figure 7B:
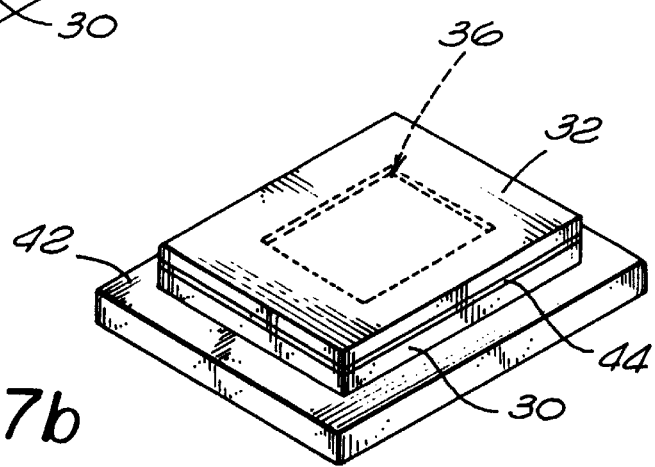

FIGS. 7a and 7b show a method for constructing the substrate 14. The first layer 30 is provided on a tooling plate 42. The first layer 30 is typically a sheet of dielectric that has copper pads and traces etched onto one or both outer surfaces of the sheet. The etched copper may include the bond pads 16. A layer of adhesive 44 is then placed onto the first layer 30. The adhesive 44 is typically provided as a sheet that is cured under heat and temperature as is known in the art. A window 46 may be cut into the sheet 44 to create the unattached area 34 of the substrate. The shim 36 may be placed into the window 46 of the adhesive sheet 44.

As shown in FIG. 7b, the second layer 32 can be then placed onto the adhesive 44. The second layer 32 is also typically a sheet of dielectric with etched copper traces. Additional layers can also placed onto the second layer 32. The layers 30 and 32, adhesive 44 and tool 42 are typically placed in a vacuum bag and subjected to heat and pressure within an autoclave. The heat and pressure reflow the adhesive 44 so that the first layer 30 is attached to the second layer 32 to create the substrate 14. The shim 36 creates the unattached area 34.

The substrate 14 is removed from the autoclave. The integrated circuit 12 can be mounted to the substrate 14 by placing the die 12 onto the bond pads 16 and then reflowing the solder bumps 22. The integrated circuit 12 may be enclosed by an encapsulant (not shown) to protect the die 12. The finished package 10 can be subsequently mounted to the external printed circuit 28.

Although a flip chip is shown and described, it is to be understood that the present invention may be utilized in other integrated circuit package assemblies. For example, an unattached area 34 may be created in the external printed circuit board 28. The unattached area 34 will allow the entire package 10 to float relative to the printed circuit board 28.

What is claimed is:

1. A method of constructing a substrate for an integrated circuit package assembly, comprising:
   a) providing a first substrate layer which has a plurality of bond pads on a top surface;
   b) placing a layer of adhesive onto a bottom surface of said first substrate layer;
   c) forming said layer of adhesive to have a window below said bond pads of an unattachment area; and,
   d) placing a second susbtrate layer onto said layer of adhesive, wherein said first substrate layer is unattached to said second substrate layer at said window of the unattachment area and said layer of adhesive attaches said second substrate layer to said first substrate layer otherwise.

2. The method as recited in claim 1, wherein said first substrate layer, said second substrate layer and said layer of adhesive are heated and pressurized to unite said second substrate layer and said first substrate layer together.

3. The method as recited in claim 1, further comprising: placing a shim into said window of the unattachment area before said second substrate layer is placed onto said layer of adhesive.

4. The method as recited in claim 1, further comprising: mounting an integrated circuit to said plurality of bond pads on the top surface of said first substrate layer.

5. The method as recited in claim 4, further comprising: mounting said second substrate layer to an external printed circuit board.

6. The method as recited in claim 1, wherein said window of the unattachment area allows an adjacent portion of said first substrate layer to move and float relative to said second substrate layer to compensate for a difference in thermal coefficient of expansion between the substrate and an integrated circuit attached thereto.

7. The method as recited in claim 1, wherein the first substrate layer and the second substrate layer are dielectric layers.

8. The method as recited in claim 7, wherein the dielectric layers of the first substrate layer and the second substrate layer further include printed circuit board traces.

9. The method as recited in claim 8, wherein the second substrate layer further includes bonding pads to mount to an external printed circuit board.

10. The method as recited in claim 1, wherein the window of the unattachment area is formed as a void.

11. The method as recited in claim 1, wherein the window of the unattachment area is formed by placing a window shaped shim on the layer of adhesive prior to placing the second substrate layer onto the layer of adhesive.

12. The method as recited in claim 1, wherein the window of the unattachment area is formed by placing a window shaped chemical composition that interrupts adhesive bonds on the layer of adhesive prior to placing the second substrate layer onto the layer of adhesive.

13. A method of constructing a substrate for an integrated circuit package assembly, comprising:
   providing a first dielectric layer having a plurality of bond pads on a top surface;
   placing an adhesive layer onto a bottom surface of the first dielectric layer;
   forming the adhesive layer to have a window of an attachment area in the center of the plurality of bond pads and a window frame of an unattachment area below the plurality of bond pads; and,
   placing a second dielectric layer onto the adhesive layer, wherein the second dielectric layer attaches to the first dielectric layer at the window of the attachment area and the second dielectric layer does not attach to the second dielectric layer at the window frame of the unattachment area.

14. The method of claim 13, wherein the second dielectric layer is attached to the first dielectric layer otherwise.

15. The method of claim 13, wherein the window frame of the unattachment area allows an adjacent portion of the first dielectric layer to move and float relative to the second dielectric layer to compensate for a difference in thermal coefficient of expansion between the substrate and an integrated circuit attached thereto.

16. The method of claim 13, wherein the first dielectric layer, the second dielectric layer and the adhesive layer are heated and pressurized to unite the second dielectric layer and the first dielectric layer together.

17. A method of constructing an integrated circuit package assembly, comprising:
   providing a first substrate layer having a plurality of bond pads on a top surface;
   placing a windowed adhesive layer onto a bottom surface of the first substrate layer, the windowed adhesive layer to have a windowed area under an area where an integrated circuit is to be affixed to the first substrate layer;

placing a second substrate layer onto the adhesive layer, wherein the windowed adhesive layer couples the second substrate layer and the first substrate layer together; and forming solder bumps on the plurality of bond bads and affixing the integrated circuit to the first substrate layer, wherein the solder bumps couple the plurality of bond pads on the top surface of said first substrate layer to a plurality of bond pads of the integrated circuit.

18. The method of claim 17, wherein the first substrate layer, the second substrate layer and the windowed adhesive layer are heated and pressurized to unite the second substrate layer and the first substrate layer together.

19. The method of claim 17, further comprising:
mounting the second substrate layer to an external printed circuit board.

20. The method of claim 17, wherein the windowed adhesive layer has a window of an attachment area in the center of the plurality of bond pads and a window frame of an unattachment area below the plurality of bond pads.

21. The method of claim 7, wherein the windowed adhesive layer has a window of an unattachment area under the area where an integrated circuit is to be affixed to the first substrate layer.

22. The method of claim 20, wherein the window frame of the unattachment area is a void.

23. The method of claim 21, wherein the window of the unattachment area is a void.

24. The method of claim 20, wherein the window frame of the unattachment area is formed by placing a window frame shaped shim on the adhesive layer prior to placing the second substrate layer onto the adhesive layer.

25. The method of claim 21, wherein the window of the unattachment area is formed by placing a window shaped shim on the adhesive layer prior to placing the second substrate layer onto the adhesive layer.

26. The method of claim 20, wherein the window frame of the unattachment area is formed by placing a window frame shaped chemical composition that interrupts adhesive bonds on the adhesive layer prior to placing the second substrate layer onto the adhesive layer.

27. The method of claim 21, wherein the window of the unattachment area is formed by placing a window shaped chemical composition that interrupts adhesive bonds on the adhesive layer prior to placing the second substrate layer onto the adhesive layer.

* * * * *

UNITED STATES PATENT AND TRADEMARK OFFICE
CERTIFICATE OF CORRECTION

| | | |
|---|---|---|
| PATENT NO. | : 6,173,489 B1 | |
| APPLICATION NO. | : 09/032628 | |
| DATED | : January 16, 2001 | |
| INVENTOR(S) | : McMahon et al. | |

It is certified that error appears in the above-identified patent and that said Letters Patent is hereby corrected as shown below:

In column 5, at line 21, in claim 21, delete "7" and replace with --17--.

Signed and Sealed this

Twenty-sixth Day of June, 2007

JON W. DUDAS
*Director of the United States Patent and Trademark Office*